(12) United States Patent
Wu et al.

(10) Patent No.: US 10,276,546 B1
(45) Date of Patent: Apr. 30, 2019

(54) SEMICONDUCTOR DEVICE WITH DIE TILT CONTROL

(71) Applicant: SanDisk Semiconductor (Shanghai) Co. Ltd., Shanghai (CN)

(72) Inventors: Shuai Wu, Shanghai (CN); Xu Wang, Shanghai (CN); Seanan Wang, Shanghai (CN); Peng Lu, Shanghai (CN); Li Wang, Shanghai (CN); Chong Un Tan, Shanghai (CN)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/969,272

(22) Filed: May 2, 2018

(30) Foreign Application Priority Data

Apr. 23, 2018 (CN) .......................... 2018 1 0366077

(51) Int. Cl.
| | |
|---|---|
| *H01L 27/00* | (2006.01) |
| *H01L 25/065* | (2006.01) |
| *H01L 23/00* | (2006.01) |
| *H01L 25/00* | (2006.01) |
| *H01L 21/00* | (2006.01) |

(52) U.S. Cl.
CPC ........ *H01L 25/0657* (2013.01); *H01L 23/564* (2013.01); *H01L 25/50* (2013.01); *H01L 2225/0651* (2013.01); *H01L 2225/06506* (2013.01); *H01L 2225/06562* (2013.01)

(58) Field of Classification Search
CPC ... H01L 25/0657; H01L 25/50; H01L 25/105; H01L 25/18; H01L 23/564; H01L 23/482; H01L 23/5389; H01L 23/3107; H01L 2225/06506; H01L 2225/0651; H01L 2225/06562

See application file for complete search history.

(56) References Cited

U.S. PATENT DOCUMENTS

| | | | |
|---|---|---|---|
| 7,732,908 B2 * | 6/2010 | Nishiyama | H01L 23/3121 257/686 |
| 9,230,942 B2 | 1/2016 | Kumar et al. | |
| 9,240,393 B2 | 1/2016 | Yu et al. | |
| 9,397,072 B2 | 7/2016 | Muto | |
| 9,799,620 B2 | 10/2017 | Huang et al. | |
| 2009/0085223 A1 * | 4/2009 | Nishiyama | H01L 23/3121 257/777 |
| 2010/0181661 A1 * | 7/2010 | Takemoto | H01L 24/24 257/686 |
| 2010/0258931 A1 * | 10/2010 | Yoshida | H01L 24/97 257/686 |
| 2010/0314725 A1 | 12/2010 | Gu et al. | |

\* cited by examiner

*Primary Examiner* — Nikolay K Yushin (74) *Attorney, Agent, or Firm* — Brinks Gilson & Lione (57) ABSTRACT

A semiconductor device with die tilt control is disclosed. In one embodiment, a semiconductor device is provided comprising: a substrate; a first semiconductor die stacked on the substrate; and a plurality of additional semiconductor dies stacked on the first semiconductor die, wherein the plurality of additional semiconductor dies are stacked in an offset configuration, such that an edge of each of the plurality of additional semiconductor dies overhangs an edge of the semiconductor die on which it is stacked; wherein a thickness of a top-most semiconductor die of the plurality of additional semiconductor dies is greater than a thickness of any of the other additional semiconductor dies. Other embodiments are provided.

16 Claims, 9 Drawing Sheets

SEMICONDUCTOR DEVICE WITH DIE TILT CONTROL

CROSS-REFERENCE TO RELATED APPLICATION

This application claims priority to Chinese Patent Application No. 201810366077.9, filed Apr. 23, 2018, which is incorporated by reference herein.

BACKGROUND

The strong growth in demand for portable consumer electronics is driving the need for high-capacity storage devices. Non-volatile semiconductor memory devices are becoming widely used to meet the ever-growing demands on digital information storage and exchange. Their portability, versatility, and rugged design, along with their high reliability and large capacity, have made such memory devices ideal for use in a wide variety of electronic devices, including for example digital cameras, digital music players, video game consoles, PDAs, and cellular telephones.

While many varied packaging configurations are known, flash memory storage cards may, in general, be fabricated as system-in-a-package (SiP) or multichip modules (MCM), where a plurality of die are mounted and interconnected on a small footprint substrate. The substrate may, in general, include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly can be encased in a molding compound, which provides a protective package.

In order to most efficiently use package footprint, it is known to stack semiconductor die on top of each other, either completely overlapping each other with a spacer layer in between adjacent die. In an offset configuration, a die is stacked on top of another die so that the bond pads of the lower die are left exposed. An offset configuration provides an advantage of convenient access of the bond pads on each of the semiconductor die in the stack.

As semiconductor die become thinner, and in order to increase memory capacity in semiconductor packages, the number of die stacked within a semiconductor package continues to increase.

DETAILED DESCRIPTION

By way of introduction, the below embodiments relate to a semiconductor device with die tilt control. In one embodiment, a semiconductor device is provided comprising: a substrate; a first semiconductor die stacked on the substrate; and a plurality of additional semiconductor dies stacked on the first semiconductor die, wherein the plurality of additional semiconductor dies are stacked in an offset configuration, such that an edge of each of the plurality of additional semiconductor dies overhangs an edge of the semiconductor die on which it is stacked; wherein a thickness of a top-most semiconductor die of the plurality of additional semiconductor dies is greater than a thickness of any of the other additional semiconductor dies.

In some embodiments, the thickness of the top-most semiconductor die of the plurality of additional semiconductor dies is sufficient to at least partially-offset tilt in another one of the plurality of additional semiconductor dies.

In some embodiments, the thickness of the top-most semiconductor die is greater than about 61 micrometers.

In some embodiments, the thickness of the top-most semiconductor die is greater than about 76 micrometers.

In some embodiments, the thickness of the top-most semiconductor die is greater than about 102 micrometers.

In some embodiments, at least one of the first semiconductor die and the plurality of additional semiconductor dies comprise a memory die.

In some embodiments, the top-most semiconductor die comprises at least one of a passive element and an active element.

In some embodiments, the top-most semiconductor die is void of a passive element and an active element.

In some embodiments, a total number of the first semiconductor die and the plurality of additional semiconductor dies is an even number.

In some embodiments, a total number of the first semiconductor die and the plurality of additional semiconductor dies is an odd number.

In another embodiment, a method of manufacturing a semiconductor die is provided. The method comprises stacking a first semiconductor die on a substrate; stacking at least one additional semiconductor die on the first semiconductor die, wherein the at least one additional semiconductor die is stacked such that an edge of each of the at least one additional semiconductor die overhangs an edge of the semiconductor die on which it is stacked, wherein at least one overhang; and stacking a tilt-offsetting semiconductor die on the at least one additional semiconductor die, wherein the tilt-offsetting semiconductor die is configured to at least partially offset upward tilt of the at least one overhang that tilts upward.

In some embodiments, the tilt-offsetting semiconductor die has a thickness greater than a thickness of any of the at least one additional semiconductor die.

In some embodiments, the tilt-offsetting semiconductor die has a thickness greater than about 61 micrometers.

In some embodiments, at least one of the first semiconductor die and the at least one additional semiconductor die comprise a memory die.

In some embodiments, the tilt-offsetting semiconductor die comprises at least one of a passive element and an active element.

In some embodiments, the method further comprises connecting wire bonds between electrically-connecting pads on the substrate, the first semiconductor die, and the at least one additional semiconductor die.

In another embodiment, a semiconductor device is provided comprising: a substrate; a first semiconductor die stacked on the substrate; and at least one additional semiconductor die stacked on the first semiconductor die, wherein the at least one additional semiconductor die is stacked such that an edge of each of the at least one additional semiconductor die overhangs an edge of the semiconductor die on which it is stacked, wherein at least one overhang that tilts upward; and means for at least partially offsetting upward tilt of the at least one overhang.

In some embodiments, the means comprises a semiconductor die that has a thickness greater than a thickness of any of the at least one additional semiconductor die.

In some embodiments, the thickness is greater than about 61 micrometers.

In some embodiments, the means comprises a semiconductor die that has a thickness greater than a thickness of any of the at least one additional semiconductor die and comprises at least one of a passive element and an active element.

Other embodiments are possible, and each of the embodiments can be used alone or together in combination. Accordingly, various embodiments will now be described with reference to the attached drawings.

The following embodiments will now be described with reference to FIGS. 1-14. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications, and equivalents of these embodiments, which are included within the scope and spirit of the invention as defined by the appended claims. Furthermore, in the following detailed description, numerous specific details are set forth in order to provide a thorough understanding. However, it will be clear to those of ordinary skill in the art that the present invention may be practiced without such specific details.

The terms "top" and "bottom," "upper" and "lower", and "vertical" and "horizontal" as may be used herein are by way of example and illustrative purposes only, and are not meant to limit the description of the invention inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment will now be explained with reference to the drawings. Although some of the figures show an individual device 100, or a portion thereof, it is understood that the device 100 may be batch processed along with a plurality of other packages 100 on a substrate panel to achieve economies of scale. The number of rows and columns of packages 100 on the substrate panel may vary.

Figure 2:
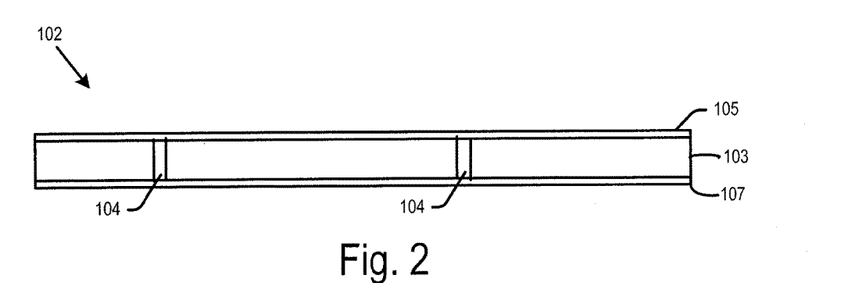
FIG. 2 is a side view of a semiconductor device at a first step in the fabrication process according to an embodiment.
Figure 3:
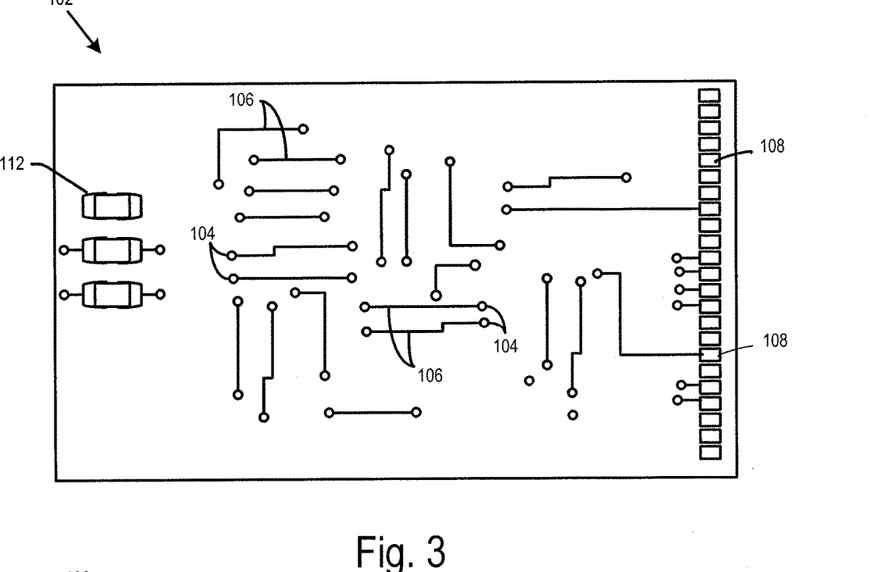
FIG. 3 is a top view of a semiconductor device at a second step in the fabrication process according to an embodiment.
Figure 4:
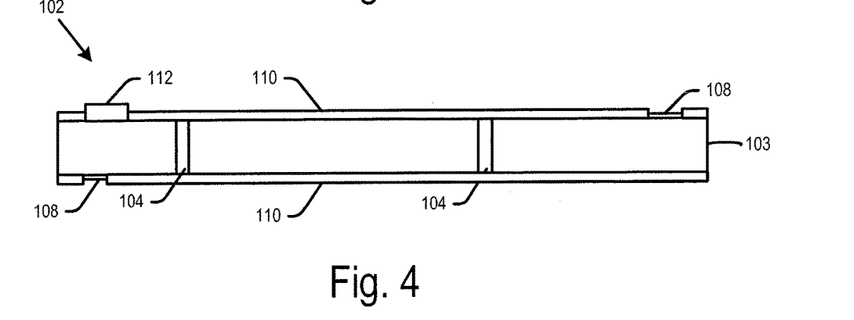
FIG. 4 is a side view of a semiconductor device at a third step in the fabrication process according to an embodiment.

The substrate panel begins with a plurality of substrates 102 (one such substrate is shown in FIG. 2. The substrate 102 may be a variety of different chip carrier mediums, including a printed circuit board (PCB), a leadframe, or a tape automated bonded (TAB) tape. Where substrate 102 is a PCB, the substrate may be formed of a core 103 having a top conductive layer 105 and a bottom conductive layer 107 as indicated in FIG. 2. The core 103 may be formed of various dielectric materials, such as, for example, polyimide laminates, epoxy resins including FR4 and FR5, bismaleimide triazine (BT), and the like. Although not critical, the core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 μm to 25 μm, although the thickness of the layers may vary outside of that range in alternative embodiments.

Figure 1:
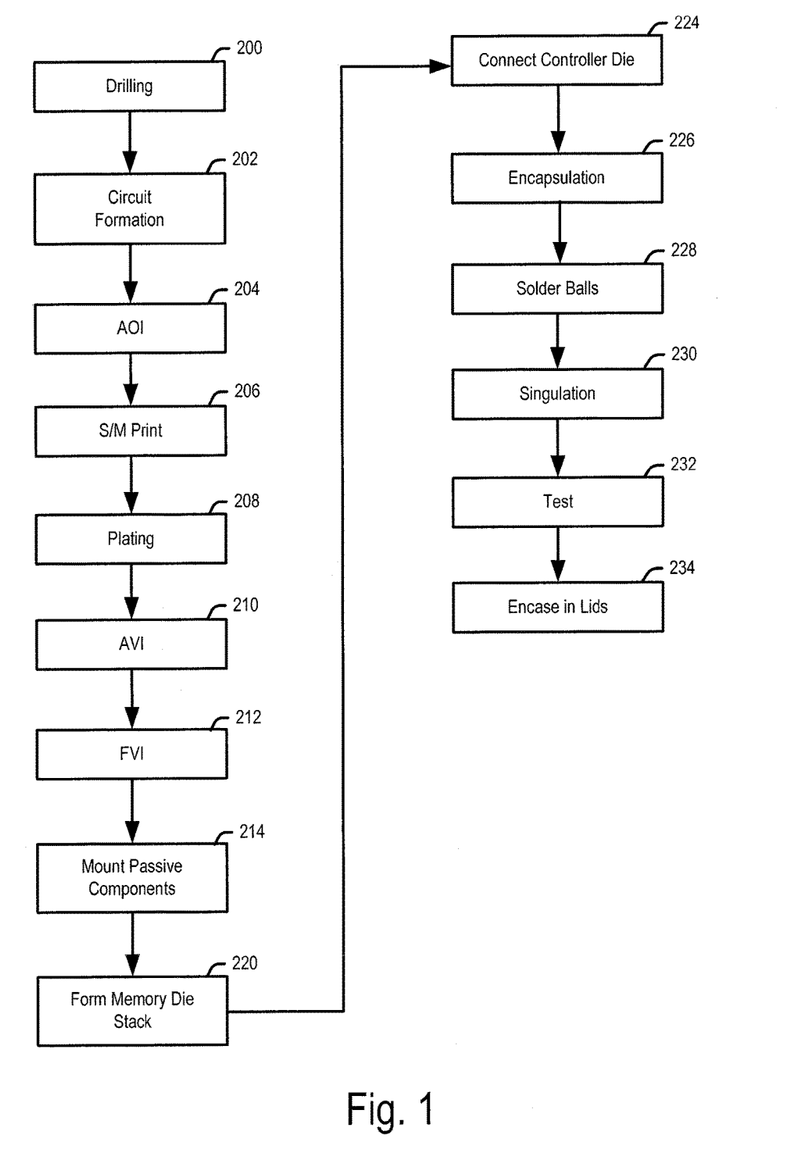
FIG. 1 is a flowchart of the overall fabrication process of a semiconductor device according to an embodiment.

FIG. 1 is a flowchart of the fabrication process for forming a semiconductor device according to an embodiment. In a step 200, the substrate 102 may be drilled to define through-hole vias 104 in the substrate 102. The vias 104 (only some of which are numbered in the figures) are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106 and contact pads 108 as shown for example in FIGS. 3 and 4. The traces 106 and contact pads 108 (only some of which are numbered in the figures) are by way of example, and the substrate 102 may include more traces and/or contact pads than is shown in the figures, and they may be in different locations than is shown in the figures.

In embodiments, the finished semiconductor device 100 assembly may be used as a BGA (ball grid array) package. A lower surface of the substrate 102 may include contact pads 108 for receiving solder balls as explained below. In further embodiments, the finished semiconductor device 100 may be an LGA (land grid array) package including contact fingers for removably coupling the finished device 100 within a host device. In such embodiments, the lower surface may include contact fingers instead of the contact pads that receive solder balls. The conductance pattern on the top and/or bottom surfaces of the substrate 102 may be formed by a variety of known processes, including, for example, various photolithographic processes.

Referring again to FIG. 1, the substrate 102 may then be inspected in an automatic optical inspection (AOI) in step 204. Once inspected, a solder mask 110 may be applied to the substrate in step 206. After the solder mask is applied, the contact pads, contact fingers and any other solder areas on the conductance patterns may be plated with a Ni/Au, Alloy 42 or the like in step 208 in a known electroplating or thin film deposition process. The substrate 102 may then be inspected and tested in an automated inspection process (step 210) and in a final visual inspection (step 212) to check electrical operation, and for contamination, scratches, and discoloration.

Assuming the substrate 102 passes inspection, passive components 112 may next be affixed to the substrate in step 214. The one or more passive components may include, for example, one or more capacitors, resistors and/or inductors, though other components are contemplated. The passive components 112 (only some of which are numbered in the figures) shown are by way of example only, and the number, type and position may vary in further embodiments. As discussed below, active elements can also be used.

Figure 5:
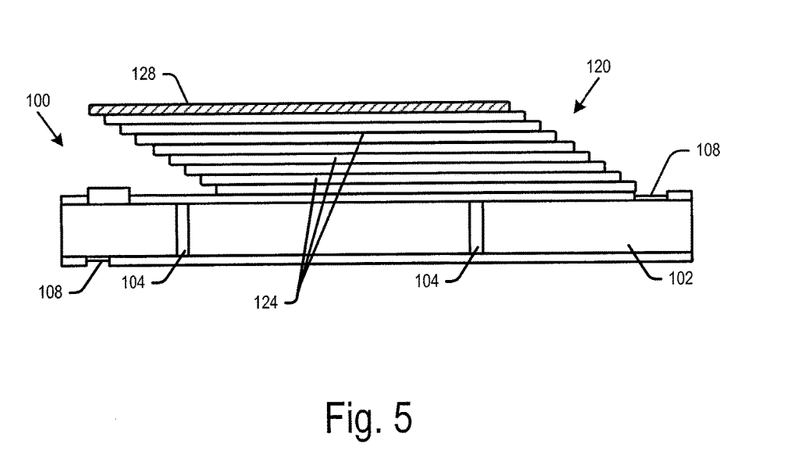
FIG. 5 is a side view of a semiconductor device at a fourth step in the fabrication process according to an embodiment.
Figure 6:
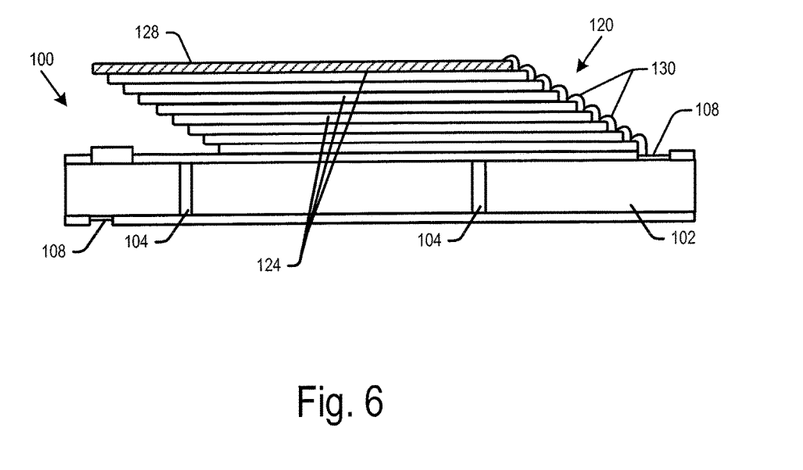
FIG. 6 is a side view of a semiconductor device at a fifth step in the fabrication process according to an embodiment.

In one embodiment, a semiconductor die stack may next be formed on the substrate 102 in step 220. Referring to FIG. 5, a number of semiconductor die 124 may be stacked atop each other in an offset stepped configuration to form a first die stack 120. The die may be affixed to the substrate and/or each other using a die attach film. As one example, the die attach adhesive may be 8988UV epoxy from Henkel AG & Co. KGaA, cured to a B-stage to preliminarily affix the die 124 in the stack 120, and subsequently cured to a final C-stage to permanently affix the die 124 in the stack 120.

The semiconductor die 124 may, for example, be a memory die such a NAND flash memory die, but other types of die 124 may be used. Accordingly, it should be understood that while "memory die" may be used herein as an example, any appropriate type of semiconductor die can be used. FIG. 5 shows an embodiment where eight die 124 are mounted in stack 120. However, there may be more or less than eight die in a stack in further embodiments. Also, multiple die stacks can be used.

After the die stack 120 is formed, an interposer layer 128 may be affixed to the upper die 124 in the stack 120 as shown in FIG. 5. The interposer layer 128 may be offset in the same way and to the same extent as the other die 124 in stack 120. Interposer layer 128 may be a rigid layer, formed for example of FR4 and FR5, or a flexible layer, formed for example of polyimide tape. A conductance pattern is formed on an upper surface of the interposer layer. As explained below, the conductance pattern and interposer layer is provided for the purpose of transferring signals from contact pads on one side of the interposer layer 128 to corresponding contact pads on the opposite side of the interposer layer. Referring now to side view of FIG. 6, once the die stack 120 is formed, the respective die 124 in the stack 120 may be electrically connected to the substrate using wire bonds 130 each of the die in the stack to the substrate 102. Thereafter, the controller die is connected (step 224), followed by encapsulation (step 226), solder balls placement (step 228), singulation (step 230), testing (step 232), and encasing in lids (step 234).

As mentioned above, as a semiconductor die becomes thinner, and in order to increase memory capacity in semiconductor packages, the number of die stacked within a semiconductor package continues to increase. One issue that can be encountered as die thickness and package thickness get thinner and thinner is semiconductor die "tilt" (or "warpage"). Semiconductor die tilt refers to the bending upward ("bowing") of an edge of a semiconductor die. In general, the mechanical strength of a semiconductor die is proportional to its thickness. Thus, reducing the thickness of the semiconductor die reduces its mechanical strength. If, during production, there is a net residual tensile stress on the semiconductor die, the semiconductor die will tend to push inwards, and the edge of the semiconductor die that overhangs a lower semiconductor die will bend upwards.

Figure 7:
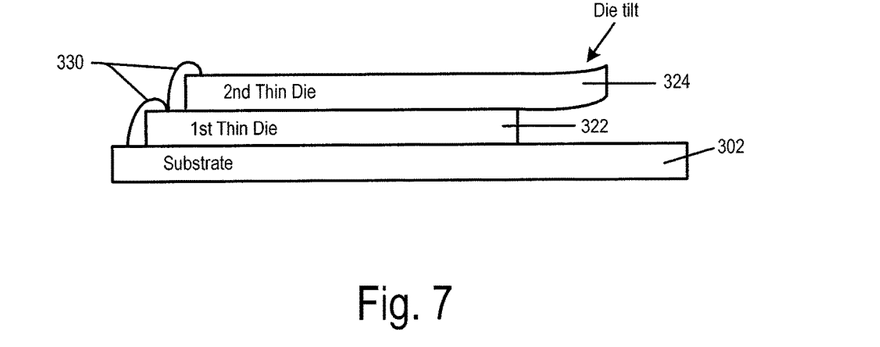
FIGS. 7 and 8 are illustrations of a die tilt problem of an embodiment.
Figure 8:
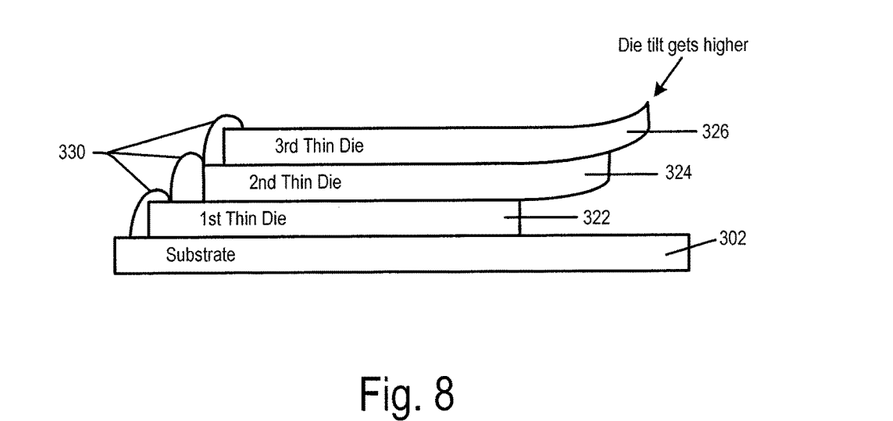

Semiconductor die tilt is illustrated diagrammatically in FIGS. 7 and 8. FIG. 7 shows a first semiconductor die 322 mounted to the substrate 302, and a second semiconductor die 324 is stacked on a first semiconductor die 322. As used herein, "stacked" or "mounted" can mean directly stacked or mounted, or indirectly stacked or mounted via one or more intermediate components. In one embodiment, the second semiconductor die 324 is stacked in an offset configuration, such that an edge of the second semiconductor die 324 overhangs an edge of the first semiconductor die 322 on which it is stacked. As shown in FIG. 7, the part of the second semiconductor die 324 that overhangs the first semiconductor die 224 (the "overhang") tilts upward. The amount of tilt increases as the number of stacked semiconductor dies increases (i.e., the die tilt accumulates with the number of semiconductor dies), as shown in FIG. 8, with a third semiconductor die 326 having a greater tilt than the second semiconductor die 324. Such bowing or warpage is not desirable as high die tilt can cause die exposure yield loss and can cause the product not to work properly. Die tilt becomes more and more of a problem as semiconductor dies become thinner and the semiconductor die stack grows higher. For example, a 3D NAND BiCS wafer typically has a thicker metal layer and higher die warpage than 2d NAND, so 3D NAND is more susceptible to semiconductor die tilt problems than 2D NAND.

Figure 9A:
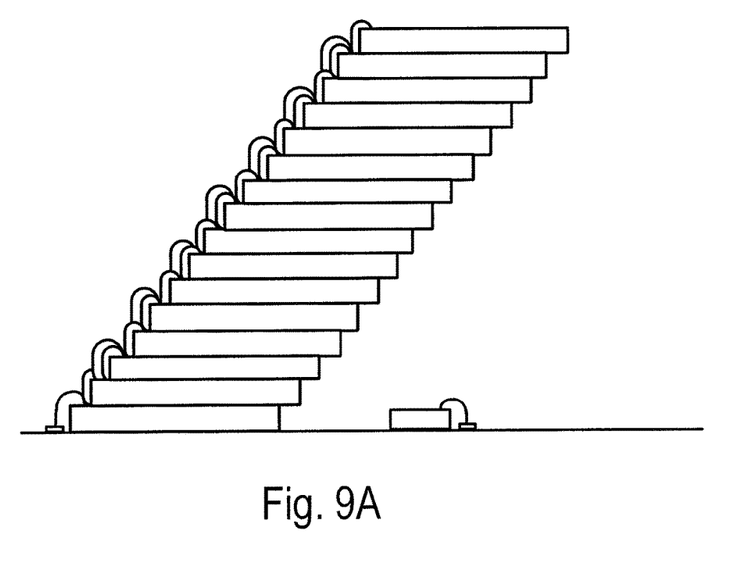
FIGS. 9A and 9B are illustrations of single and dual die stacks of an embodiment.
Figure 9B:
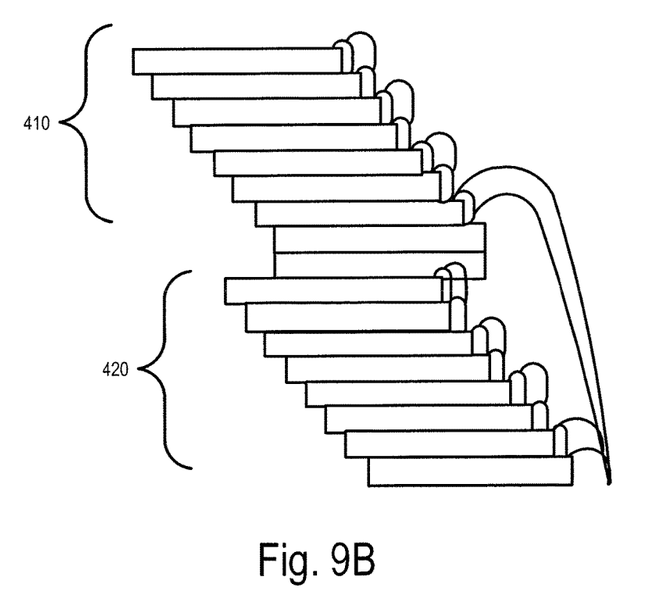

Several techniques can be used to mitigate (or ideally eliminate) semiconductor die tilt in a semiconductor package caused by accumulated die warpage at the end of each semiconductor die opposing the end to be subsequently wire bonded. For example, an epoxy pillar can be dispensed on the overhang of the top-most semiconductor die to try to balance the die tilt. However, introducing a dispenser process after die attach can require a new process and control method. Further, there is a potential reliability risk with this approach. Namely, dispensing the epoxy pillar and mold compound would be a two-step process, and there would be an interface between the epoxy pillar and the mold compound. If moisture gets into the interface, a failure may occur that can affect reliability. As another example, a single die stack 400 (FIG. 9A) can be replaced by two die stacks 410, 420 (FIG. 9B) to reduce the die tilt accumulation. (As shown in FIG. 9B, due to the overhang, a thick die is used as the ninth die, with the other dies being thinner.) However, there can be several deficiencies with this approach. First, this approach can involve replacing a one-time die attach process with a multi-die attach process and a one-time memory wire bond process with a two-time memory wire bond process. Further, this approach may result in increasing junction die quantity. Generally, the junction die can suffer higher mechanical stress and have a higher possibility of cracking. So, the higher the junction die quantity, the more likely the chance of higher yield loss.

In one embodiment, semiconductor die tilt is addressed by using a thicker die 328 at the top of the stack (i.e., distally located in the stack from the substrate 302) than the thinner dies 322, 324, 326 underneath it (FIG. 10), even if the dies underneath it do not have a uniform thickness. (While a single top, thicker die was used in this example, in another embodiment, the top X number of dies are thicker than the rest, where X>1). The top die can be manufactured like the other dies, but with the top die having a greater thickness. With a sufficiently-high modulus from being thicker, the top die can at least partially offset tilt in one or more of the thinner semiconductor dies under it, thereby at least partially balancing out the tilt on one or more of the thin dies underneath it, thereby reducing overall die tilt. In one embodiment, when 4-16 dies are stacked and the thin dies are less than about 61 um, the thickness of the top-most semiconductor die is greater than about 61 um, 76 um, or 102 um. Of course, other appropriate thicknesses can be used. In general, the greater the thickness of the top-most semiconductor die, the better the tilt control.

There are several advantages associated with these embodiments. For example, as compared to the multiple die stack approach discussed above, this embodiment uses a one-way die stack design, a two-times die attach process, and a one-time memory wire bond process. This provides tilt control using a single run of a wire bond procedure, introduces no additional material interfaces, and has an overall better die tilt control effect without the potential reliability risk noted above. As such, these embodiments can be used to help make high-capacity storage products with thinner packages.

Figure 10:
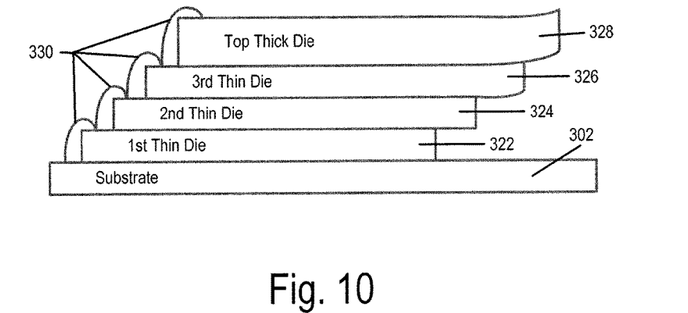
FIG. 10 is an illustration of a die tilt solution of an embodiment.
Figure 11:
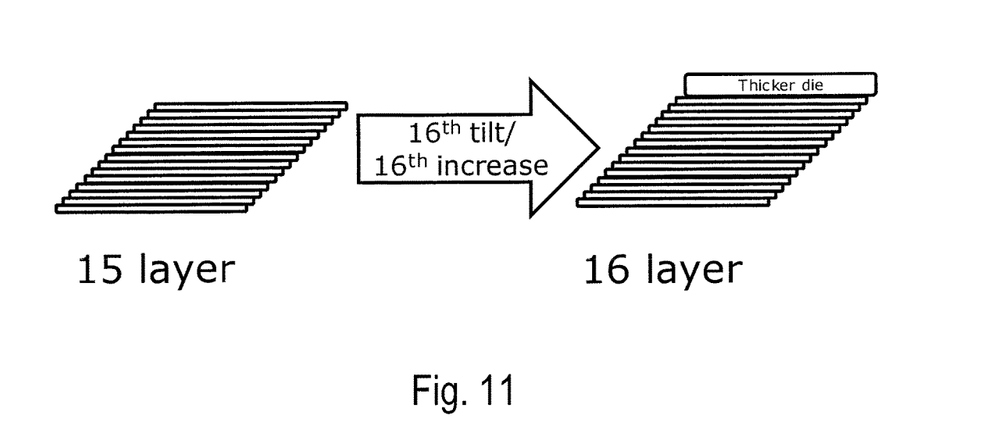
FIG. 11 is an illustration of a die stack with a thicker top die of an embodiment.

These embodiments can be implemented in any suitable way. For example, as shown in FIG. 10, the thicker, top die in the memory stack can be like the other dies in the memory stack, with wire bonds electrically connecting it to the other dies in the stack. That is, like the dies below it, the top die can be a "functional" die, in that it contains passive and/or active elements, in any combination. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material. In the example shown in FIG. 11, the thicker, top die is the 16$^{th}$ die in a 16-die stack.

In another embodiment, the thicker, top die in the stack is a non-functional die (e.g., a "dummy die" or a "mirror") and is merely there to provide tilt control. In this alternative, if a 16-die stack is used, there would be 16 functional dies, and one "mirror" die on top, for a total of 17 dies in the stack (i.e., a total odd number instead of a total even number). However, using a functional die as the top-most, thick die avoids the need for a spacer and can result in high die attach unit per hour (DA UPH) and lower cost (e.g., the cost of the mirror die). Taking a 16 die stack as an example, when using a functional die, a total of 16 dies are used. 15×DA UPH will be higher than 16×DA, and there is no need for a mirror. In contrast, when using a mirror die instead of a functional die, there would be 17 total dies (16 functional and one mirror). The use of the mirror die can mean a lower UPH and higher cost.

Figure 12:
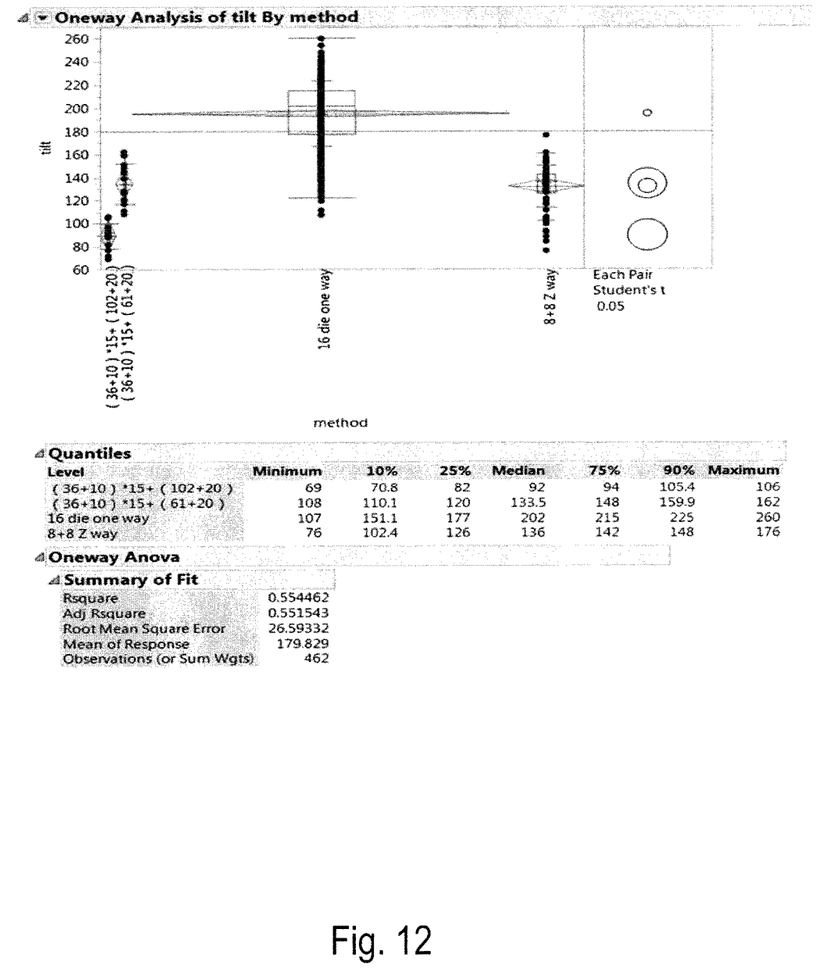
FIG. 12 is a graph illustrating die tilt in a plurality of die stacks of an embodiment.
Figure 13:
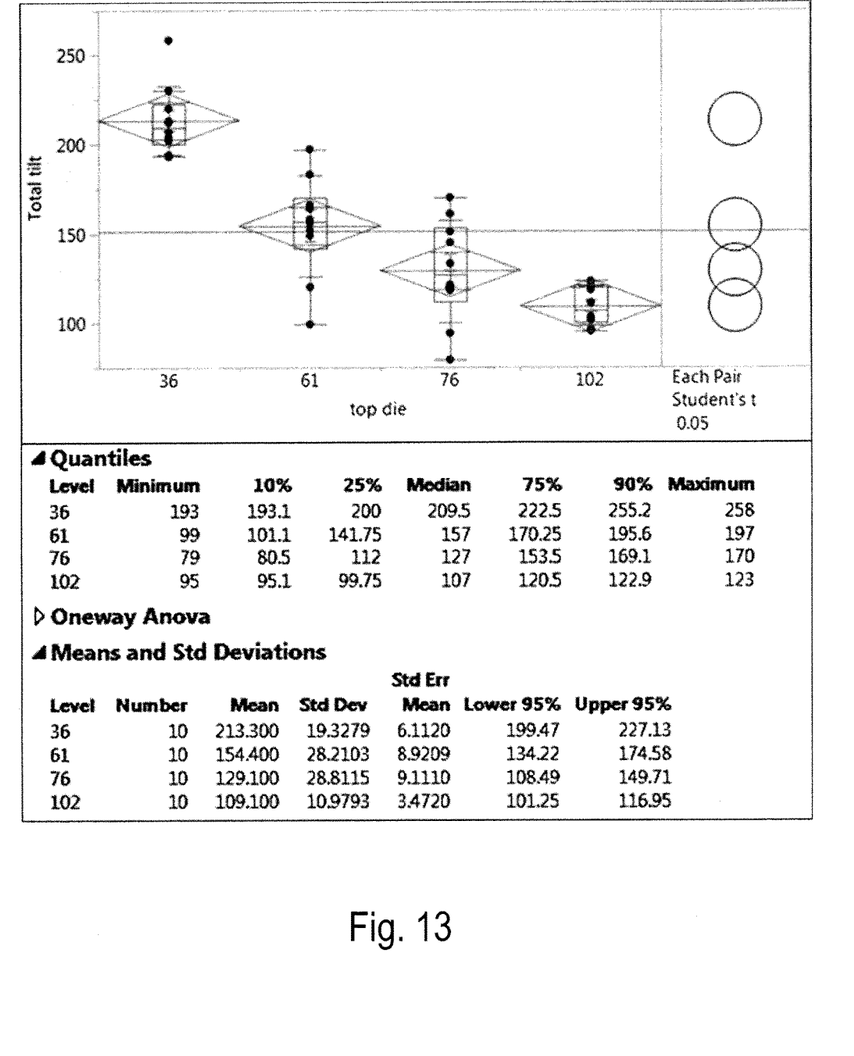
FIG. 13 is a graph illustrating $16^{th}$ die tilt of an embodiment.
Figure 14:
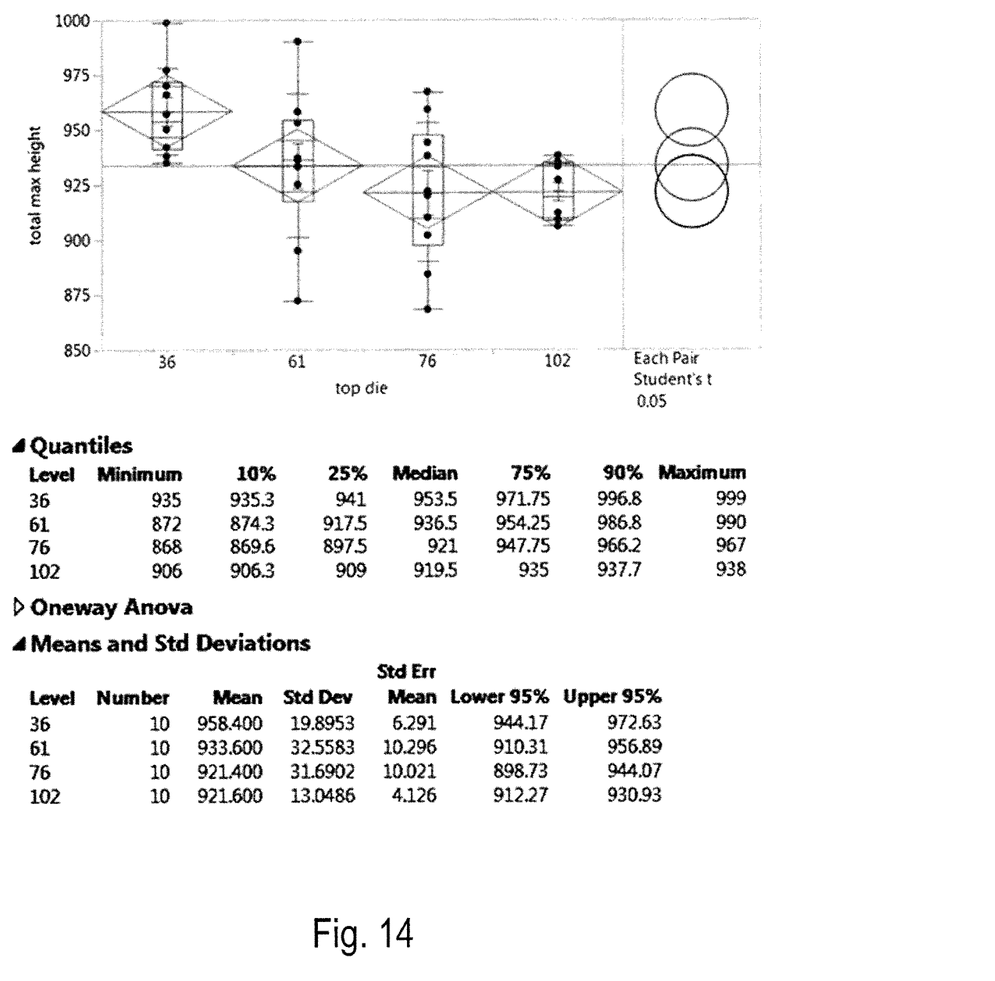
FIG. 14 is a graph illustrating die tilt in a 16-layer die stack of an embodiment.

FIGS. 12-14 present modelling data of die tilt in a 16-die structure. In general, this data shows that, with the top die getting thicker, the die tilt and the total stack height becomes lower. More specifically, FIG. 12 shows that the die tilt control effect is better with a thicker top die, with the "36/10*15+102/20" option having the smallest die tilt. 36 is the die thickness, 10 is the die attach film thickness, and 15 is the number of dies. 102 is the top die thickness, and 20 is the die attach thickness for the top die.

In FIGS. 13 and 14, four experiments ("legs") were performed.

| Leg | Stack | Top Die |
|---|---|---|
| 1 | 36/10 * 16 | 36/10 |
| 2 | 36/10 * 15 + 61/20 | 61/20 |
| 3 | 36/10 * 15 + 76/10 | 76/10 |
| 4 | 36/10 * 15 + 102/20 | 102/20 |

The purpose of these experiments was to verify the relationship between die tilt and different top die thicknesses, as well as to determine the efficient and side effects of the tooling (e.g., pick up issue and crack issue). The material used in these experiments was a BiCS3 256G dummy wafer/760 DAF: 36/10 um, 61/20 um, 76/10 um (SKT), 102/20 um, with DA 800, and a normal rub tip holder. As shown in FIGS. 13 and 14, with the top die thickness increasing, the top die tilt decreases, and the maximum stack height decreases. Also, when the top die had a thickness of 102 um, the standard deviation of die tilt and maximum stack height got smaller.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A semiconductor device comprising:
    a substrate;
    a first semiconductor die stacked on the substrate; and
    a plurality of additional semiconductor dies stacked on the first semiconductor die, wherein the plurality of additional semiconductor dies are stacked in an offset configuration, such that an edge of each of the plurality of additional semiconductor dies overhangs an edge of a semiconductor die on which it is stacked;
    wherein a thickness of a top-most semiconductor die of the plurality of additional semiconductor dies is greater than a thickness of any of the other additional semiconductor dies, wherein the top-most semiconductor die is not active, and wherein a total number of the first semiconductor die and the plurality of additional semiconductor dies is an odd number.

2. The semiconductor device of claim 1, wherein the thickness of the top-most semiconductor die of the plurality of additional semiconductor dies is sufficient to at least partially-offset tilt in another one of the plurality of additional semiconductor dies.

3. The semiconductor device of claim 1, wherein the thickness of the top-most semiconductor die is greater than about 61 micrometers.

4. The semiconductor device of claim 3, wherein the thickness of the top-most semiconductor die is greater than about 76 micrometers.

5. The semiconductor device of claim 4, wherein the thickness of the top-most semiconductor die is greater than about 102 micrometers.

6. The semiconductor device of claim 1, wherein at least one of the first semiconductor die and the plurality of additional semiconductor dies comprise a memory die.

7. A method of manufacturing a semiconductor die, the method comprising:
    stacking a first semiconductor die on a substrate;
    stacking at least one additional semiconductor die on the first semiconductor die, wherein the at least one additional semiconductor die is stacked such that an edge of each of the at least one additional semiconductor die overhangs an edge of a semiconductor die on which it is stacked, wherein at least one overhang; and stacking a tilt-offsetting semiconductor die on the at least one additional semiconductor die, wherein the tilt-offsetting semiconductor die is configured to at least partially offset upward tilt of the at least one overhang that tilts upward and is not active.

8. The method of claim 7, wherein the tilt-offsetting semiconductor die has a thickness greater than a thickness of any of the at least one additional semiconductor die.

9. The method of claim 7, wherein the tilt-offsetting semiconductor die has a thickness greater than about 61 micrometers.

10. The method of claim 7, wherein at least one of the first semiconductor die and the at least one additional semiconductor die comprise a memory die.

11. The method of claim 7, wherein the tilt-offsetting semiconductor die comprises at least one of a passive element and an active element.

12. The method of claim 7 further comprising connecting wire bonds between electrically-connecting pads on the substrate, the first semiconductor die, and the at least one additional semiconductor die.

13. A semiconductor device comprising:
a substrate;
a first semiconductor die stacked on the substrate; and
at least one additional semiconductor die stacked on the first semiconductor die, wherein the at least one additional semiconductor die is stacked such that an edge of each of the at least one additional semiconductor die overhangs an edge of a semiconductor die on which it is stacked, wherein at least one overhang that tilts upward; and means for at least partially offsetting upward tilt of the at least one overhang, wherein the means comprises a semiconductor die that is not active.

14. A semiconductor device comprising:
a substrate;
a first semiconductor die stacked on the substrate, the first semiconductor die having a x-axis and a y-axis being defined parallel with orthogonal edges of the first semiconductor die; and
a plurality of additional semiconductor dies mounted on the first semiconductor die, wherein the plurality of additional semiconductor dies have a x-axis and a y-axis being defined parallel with orthogonal edges of the plurality of additional semiconductor dies, further wherein each of the plurality of additional semiconductor dies are mounted to be offset along the x-axis with respect to the first semiconductor die;
wherein a thickness of a top-most semiconductor die of the plurality of additional semiconductor dies is greater than a thickness of any of the other additional semiconductor dies, wherein the top-most semiconductor die is not active, and wherein a total number of the first semiconductor die and the plurality of additional semiconductor dies is an odd number.

15. The semiconductor device of claim 14, wherein the thickness is greater than about 61 micrometers.

16. The semiconductor device of claim 14, wherein the wherein the thickness of the top-most semiconductor die of the plurality of additional semiconductor dies is sufficient to at least partially-offset tilt in another one of the plurality of additional semiconductor dies.

* * * * *